United States Patent [19]

Hoppe et al.

[11] 4,417,413
[45] Nov. 29, 1983

[54] IDENTIFICATION CARD WITH IC CHIP AND A METHOD FOR MANUFACTURING THE SAME

[75] Inventors: Joachim Hoppe; Yahya Haghiri-Tehrani, both of Munich, Fed. Rep. of Germany

[73] Assignee: GAO Gesellschaft fur Automation und Organisation mbH, Munich, Fed. Rep. of Germany

[21] Appl. No.: 444,964

[22] Filed: Nov. 29, 1982

Related U.S. Application Data

[63] Continuation of Ser. No. 148,612, May 12, 1980, abandoned.

[30] Foreign Application Priority Data

May 17, 1979 [DE] Fed. Rep. of Germany ....... 2920012

[51] Int. Cl.³ .................. G06K 7/06; G06K 19/00
[52] U.S. Cl. ......................................... 40/630; 40/625; 235/441; 235/488
[58] Field of Search ................. 40/625, 626, 627, 628, 40/629, 630, 631; 283/74, 75, 76, 77, 78, 82, 83, 84, 107, 108, 109, 110, 111, 112; 235/487, 488, 441-443, 492; 307/303

[56] References Cited

U.S. PATENT DOCUMENTS

| | | | |
|---|---|---|---|
| 3,637,994 | 1/1972 | Ellingboe | 235/488 |
| 3,702,464 | 11/1972 | Castrucci | 235/492 |
| 3,934,122 | 1/1976 | Riccitelli | 235/492 |
| 4,004,133 | 1/1977 | Hannan et al. | 235/487 |
| 4,105,156 | 8/1978 | Dethloff | 235/441 |
| 4,200,227 | 4/1980 | Lemelson | 235/488 |
| 4,222,516 | 9/1980 | Badet et al. | 235/492 |

*Primary Examiner*—Robert P. Swiatek
*Assistant Examiner*—Michael J. Foycik
*Attorney, Agent, or Firm*—Neuman, Williams, Anderson & Olson

[57] ABSTRACT

An identification card incorporating an integrated circuit (IC) chip for processing electric signals incorporates a separate supporting element for the IC chip. The supporting element is mounted in a window of one corner of the identification card to avoid the principal axis of stress. The chip supporting element and the window are of the same general shape. However, the window is larger than the supporting element to provide a clearance area surrounding the supporting element. Resilient cover sheets are adhesively mounted to the identification card to fix the position of the supporting element within the window and maintain the clearance area surrounding the supporting element. The top cover sheet has a recess which is aligned with a portion of the supporting element to allow access to contacts mounted on that portion of the supporting element to provide electrical connections with the IC chip.

11 Claims, 3 Drawing Figures

IDENTIFICATION CARD WITH IC CHIP AND A METHOD FOR MANUFACTURING THE SAME

This is a continuation of application Ser. No. 148,612 filed May 12, 1980, now abandoned, the text of which is hereby incorporated by reference.

This invention concerns an identification card with an IC chip for processing electric signals, the card being mounted on a separate supporting element and the element being mounted in a window of the identification card.

An identification card with an embedded IC chip is already known. The chip, together with all conductors and contacts, is mounted on a supporting plate which in turn is mounted in a recess or window of the identification card. The supporting plate is rigidly connected to the identification card by means of adhesion or fusion. The contact surfaces are situated on the side of the supporting plate on which the IC chip is mounted. For this reason, access to the contacts is only possible by means of appropriate through-holes in the identification card.

The known card discloses for the first time a method for embedding complex IC chips in identification cards. However, this known card construction has still so many disadvantages that the practical application of such identification cards, which are equipped with IC chips, is completely out of the question for the time being. One particular problem is the connection of the IC chip or the supporting plate, to which the IC chip adheres, to the card material. As is commonly known, such identification cards are subject to heavy bending loads in their everyday use, and in the case of the known construction these bending loads are transmitted directly to the conductors of the IC chip. These alternating loads can be the cause of conduction interruption and defects of the IC chip.

As a result of different flexural stiffness of the supporting plate, on the one hand, and the identification card, on the other hand, a high degree of stress concentration is built up at the connection seams, and this can easily lead to splitting or cracking and hence to the separation of the supporting plate from the identification card.

Apart from these fundamental difficulties, the known card construction has further disadvantages resulting from its specific structural design. Since the contact surfaces are only accessible through holes in the identification card itself, it is necessary to fill the holes with a conducting material in order to prevent dirtying and clogging of the contacts. This necessitates an additional operational step. The supporting plate with the IC chip is of such a height, at least in the integrated condition, that it can only be arranged in the portion of a standardised card in which embossed recesses are permitted. In accordance with the standards valid at present, these embossed areas are confined to the width of a line only, whereas the IC chip requires a recess which extends over several lines. For this reason it is impossible to embody the known cards in such a manner that they are in keeping with valid standards.

The multi-stage recesses with various material thicknesses, necessary for the embedment of the supporting plates, are relatively costly with respect to their manufacture. In addition, they can only be applied in the case of cards consisting wholly of plastic.

SUMMARY OF THE INVENTION

It is the object of the invention to provide an identification card of the type mentioned hereinbefore and a method for manufacturing the same. In so doing, the connection between the supporting element with the IC chip and the body of the card should be designed such that it will resist very heavy alternating bending loads.

In accordance with the invention, this object is solved by the features stated in the characterizing clause of the main claim.

The invention exploits the knowledge that instead of the IC chip itself an intermediate product must be embedded in the card, this product including the IC chip and all the appropriate contact elements. This supporting element can be manufactured by an electronic manufacturer correspondingly specialised for the task, whereby high-quality materials are used and corresponding demands are made on production. The embedment of the supporting elements in the identification cards may, on the other hand, be carried out by a manufacturer specialised in the manufacture of identification cards, using his conventional know-how. A pre-requisite for the success of the invention is the design of the supporting element as a closed unit, in the interior of which the IC chip is embedded and on one side of which the contact surfaces are located. When embedding the supporting element in an appropriately shaped window of the identification card, an intermediate space remains round about the supporting element, with the result that even in the case of a high degree of bending of the identification card no direct material contact between the identification card and the supporting element (for instance as might be caused by wedging) can take place. The supporting element is held in position by means of resilient connecting elements which bridge the gap between the supporting element and the identification card. In so doing, the gap may also be bridged by filling it up with a resilient material.

In accordance with an advantageous development of the invention, the resilient connecting elements comprise cover sheets which are laminated on the upper and/or lower side of the card inlet. In so doing, the supporting element is held only by the cover sheet which may be self-adhesive, for instance. One of the cover sheets must naturally have an appropriate recess in the region of the contact surfaces of the supporting elements. The contacts are thus freely accessible and as a result self-cleansing, and this does not necessitate an additional operational procedure. Since the cover sheets are applied in accordance with what is known as the cold laminating process, the IC chip is not subjected to thermal load.

Further advantageous developments of the invention are the subject of subordinate claims.

As a result of the floating embedment of the supporting element, which is embodied as a closed unit, in a window of the identification card, the card is rendered so durable, even when subjected to extreme alternating loads, that its practical application is now possible for the first time ever.

BRIEF DESCRIPTION OF THE DRAWINGS

An embodiment of the invention will now be described in the following with reference to the drawing in which, by way of example.

DESCRIPTION OF THE PREFERRED EMBODIMENT

In the embodiment example shown, the window, in which the supporting element is disposed, is situated in one corner of the identification card, outside the principal axis of stress. Such an arrangement has proved to be advantageous because the card does not become deformed to such a large extent in this area. The identification card 10 comprises as usual a conventional card inlet 12 which is laminated on its upper and lower side with cover sheets 14 and 16. The application of the sheets may be carried out in accordance with the so-called cold lamination coating method, that is to say without the application of heat. The card inlet 12 may be made wholly of plastic; however, it is also possible to use a multi-layer element made of paper, which in addition can exhibit all the usual identifying marks used for identification cards.

Figure 1:
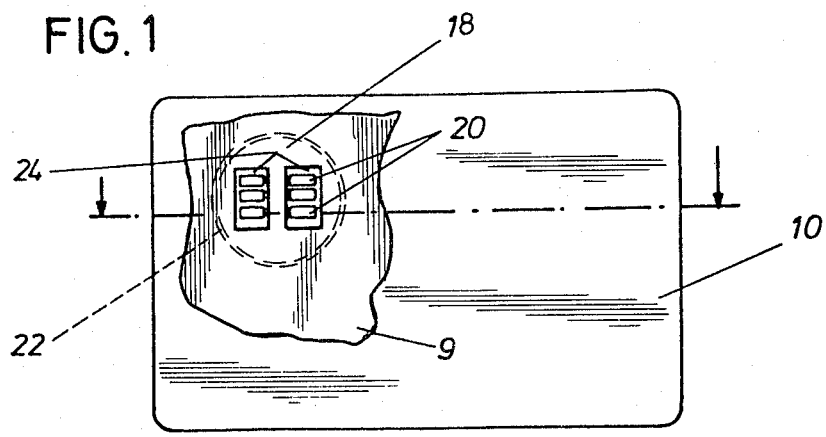
FIG. 1 is a plan view of an identification card with embedded supporting element.
Figure 2:
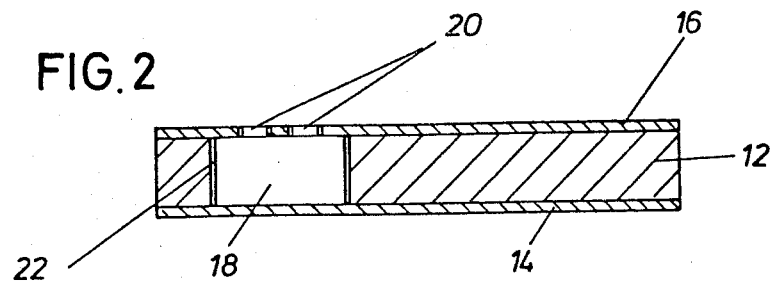
FIG. 2 is a cross-sectional view of the identification card and the supporting element.

A supporting element 18 is disposed in the circular window in the top left corner of the identification card (FIG. 1), and this supporting element is disc-shaped in the example illustrated. Its diameter can be in the range of 15 to 20 mm. The diameter of the disc-shaped supporting element is basically determined by the number of contacts. If the number of contacts are reduced, the diameter can also be reduced accordingly.

The element is embedded in an appropriate recess provided in the identification card 10, and the diameter of the recess is somewhat larger than the external diameter of the supporting element. Thus, an annular clearance 22 remains round about the supporting element, and it is of such a size that no direct contact between the side walls of the card inlet 12 and the supporting element 18 occurs, even when the identification card is bent to its maximum.

The supporting element 18 is held in the recess only by means of the two resilient cover sheets 14 and 16 which are self-adhesive, so that the element 18 is positioned in the recess in such a manner that it cannot be shifted.

In the region of the contact surfaces 20 of the supporting element 18 the cover sheet 16 has a recess 24 which permits access to the contacts 20. The two cover sheets 14 and 16 are preferably printed. Particularly in the region of the recess 24, an opaque printed picture 9 can be provided to optically hide the point of connection between the identification card and the supporting element. In addition, the sheet can exhibit further security or functional features, such as for instance an additional magnetic track.

The supporting element will now be explained in the following with reference to FIG. 3. It comprises a lower cover film 26 which is coated with an adhesive and disposed on a sheet 28 for thickness accomodation. This sheet for accomodating thickness has punchings 34 which are large enough to freely accomodate an IC chip 30. On its upper side the supporting element 18 is covered by a conductor sheet 32 on the front side of which the contact surfaces 20 are disposed and on the rear side of which the metal conductors 31 for the IC chip 30 are arranged. The metal conductors 31 are contacted through to the contact surfaces 20 on the front side.

The contact surfaces 20 are of preferably the same thickness as that of the cover sheet 16, so that the surface of the contacts is directly in alignment with the surface of the card and the contacts are always kept clean by friction. The height or thickness of the complete supporting element corresponds in this case to the thickness of the identification card when the thickness of the lower cover sheet 14 is subtracted.

The IC chip 30 is mounted in the interior of the supporting element 18 by means of a resilient adhesive mass 33, for instance of silicone adhesive.

The cover sheet 26 and the sheet 28 for thickness accomodation are relatively inflexible, with the result that the supporting element 18 is on the whole very rigid and cannot be bent. The element is stabilised even more by virtue of its box-shaped structure. The IC chip 30 mounted in the interior of the supporting element on the resilient silicone drop is thus ideally protected.

For manufacturing the supporting element 18, the conductor sheet 32 is first of all coated on both sides with copper. Subsequently, the contact surfaces 20 on the front side of the conductor sheet and the metal conductors 31 for the IC chip on the rear side of the conductor sheet are cauterised. The contact surfaces and the metal conductors are finally connected to each other by means of the throughcontacting method.

After that, a sheet 28 for thickness accomodation, which can also be embodied as a self-adhesive sheet, is laminated onto the conductor sheet 32 in the correct position. Before this can take place, appropriate recesses 34 for the IC chips must be punched in the sheet for thickness accomodation. The recesses must be larger than the IC chips so that the latter can be freely supported.

After the IC chip 30 is connected to the ends of the metal conductors 31 in accordance with a known manufacturing method, the cover film 26 is laminated onto the recess 34, accomodating the chip.

Figure 3:
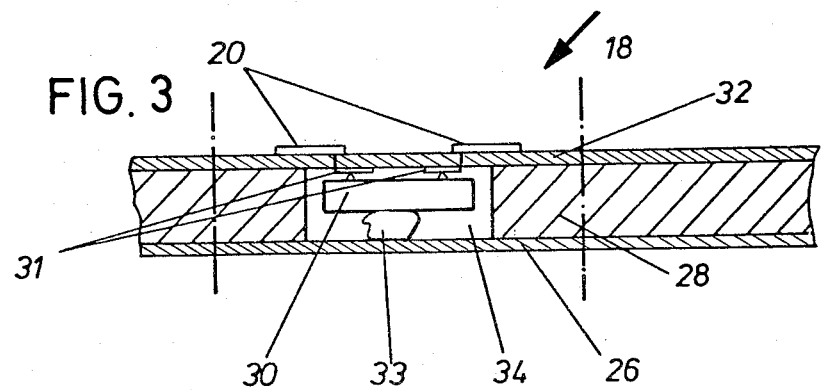
FIG. 3 is a cross-sectional view of the supporting element on its own.

As shown in FIG. 3, the chip is mounted with the aid of a resilient adhesive mass 33.

For the individual manufacture of identification cards by hand, the supporting element 18 is punched out of the united sheets (broken lines in FIG. 3), so that it can be inserted as a separate element in the window of the identification card, provided for this purpose. In this stage of production, the identification card comprises the card inlet 12 on which the front cover sheet 16, which has the recess 24 for the contact surfaces of the supporting element, is laminated.

For the purpose of positioning, the recess 24, which is appropriate to the contact surfaces 20, may be used. Positioning may also be carried out by means of an appropriate design of the supporting element which is adapted to the window of the card and functions with a spring-groove locating device, or the like. Finally, after insertion of the supporting element, the rear cover sheet is laminated onto the card.

For the series production of IC identification cards, positioning is carried out automatically, in which case the supporting elements, which are mounted on a conveyor belt are fed into an appropriate device in a timed order together with the identification cards to be filled. In this case, the positioning aid, which may be provided on the supporting element and on the identification card for manual production, can be omitted, that is to say the supporting element can also be circular.

Independent of the method of production used, the two cover sheets 14 and 16 consist of a highly resilient material, as compared with the material of the supporting element 18. When the card is bent in the region of the window, the deformation energy is absorbed for the most part by the resilient covers. The supporting element itself is hardly affected at all by bending.

If the supporting element is embodied so as to be very rigid in comparison to the materials of the identification card, the deformation energy must be completely absorbed by the cover sheets. Hence, it is completely impossible for the supporting element to be damaged. However, as compared with the case mentioned first, in which the supporting element absorbs a small amount of the deformation energy, earlier fatigue of the cover sheet material is expected.

Finally, it must be noted that the optical design of the card is hardly affected by the embedded supporting element. Therefore, the card can be applied both for automatic and individual optical examination.

What is claimed is:

1. An identification card comprising a flexible substrate; an IC module for the processing of electrical signals; a separate carrier element to which said IC module is attached; contact surfaces located on said carrier element for engaging electrodes exteriorly disposed of said card; leads interconnecting said IC module and said contact surfaces; said substrate having a window for reception of said carrier element; said carrier element being substantially as thick as said identification card and completely surrounding said IC module; said window being slightly larger than said carrier element whereby a gap surrounds the periphery of said carrier element; resilient means for supporting said carrier element in said window and bridging such gap; said resilient means effecting bonds supporting said carrier element in said window which bonds remain unbroken during flexing of said card in the normal course of card use; said carrier element having greater resistance to bending than said card portions surrounding said carrier element, whereby said carrier element may extend beyond a surface of said card when the card portions surrounding said carrier element are flexed into a nonplanar configuration.

2. The identification card according to claim 1 in combination with flexible cover sheets defining opposed faces of said identification card and which comprise the resilient supporting means; said cover sheets being so flexible and said window being of such size relative to said carrier element therein that card portions adjacent to said window may bend without wedging said carrier element therebetween.

3. The identification card according to claim 2 wherein one of said cover sheets is apertured in the region of the contact surfaces whereby said contact surfaces are exposed on a card surface.

4. The identification card according to claim 2, wherein said cover sheets are adhesively secured to said card substrate and said carrier element, and the carrier element is held in position only by said cover sheets.

5. The identification card according to claim 2, wherein said cover sheets are provided with a printed pattern which covers the gap between the carrier element and the card substrate.

6. The identification card according to claim 1 wherein the carrier element comprises a box-shaped structure supportably engaging said IC module, said leads and said contact surfaces.

7. The identification card according to claim 6 wherein said contact surfaces provided on at least one surface of the carrier element are electically connected to the IC module by means of said leads which extend through a wall of said carrier element.

8. The identification card according to claim 6 wherein the IC module is resiliently mounted within the carrier element.

9. The identification card according to claim 6 wherein the carrier element is circular in cross-section.

10. The identification card according to claim 1 wherein the carrier element and the window in the identification card are provided with positioning aids for desired location of said carrier element in said window.

11. A method for the manufacture of identification cards, each of said cards having an IC module enclosed within a carrier element which is in turn resiliently mounted in an opening disposed in a body portion of the identification card; said carrier element having contact areas mounted on at least one of its surfaces which areas are substantially flush with the outer surface of said card; the steps comprising forming openings in a card sheet from which identification card body portions are to be formed; laminating a cover sheet to said card sheet and punching out contact openings in said cover sheet for access to said contact areas; inserting the carrier elements in said openings in said card sheet from which said card body portions are to be formed, and locating said carrier elements in said openings so that said carrier elements are spaced from the peripheries of the openings in said card sheet; and interfitting said contact areas of the carrier elements in said cover sheet openings; laminating a second cover sheet to said card sheet whereby each carrier element is resiliently mounted in an opening in the resulting card-cover sheet assembly between opposed cover sheets; and forming individual identification cards from such assembly.

* * * * *